United States Patent [19]

Upadhya et al.

[11] Patent Number: 5,468,357
[45] Date of Patent: Nov. 21, 1995

[54] DENSIFICATION OF POROUS ARTICLES BY PLASMA ENHANCED CHEMICAL VAPOR INFILTRATION

[75] Inventors: Kamleshwar Upadhya, Quartz Hill; Wesley P. Hoffman, Palmdale, both of Calif.

[73] Assignee: Hughes Missile Systems Company, Los Angeles, Calif.

[21] Appl. No.: 364,157

[22] Filed: Dec. 27, 1994

[51] Int. Cl.[6] ................................. C01B 31/00
[52] U.S. Cl. .................... 204/173; 204/164; 204/165
[58] Field of Search ............................. 204/173, 164, 204/165

[56] References Cited

U.S. PATENT DOCUMENTS

| | | | |
|---|---|---|---|
| 3,411,949 | 11/1968 | Hough | 204/173 |
| 3,745,104 | 7/1973 | Hou | 204/165 |
| 4,707,231 | 11/1987 | Berger | 204/165 |
| 4,956,858 | 9/1990 | Upadhya | 378/133 |

Primary Examiner—John Niebling
Assistant Examiner—Kishor Mayekar
Attorney, Agent, or Firm—Charles D. Brown; Randall M. Heald; Wanda K. Denson-Low

[57] ABSTRACT

A porous article is densified by creating a plasma adjacent to the surface of the article and introducing a source of a densifying species into the plasma. The article is electrically biased with respect to the plasma to a polarization opposite in sign to the energized densifying species and to a first voltage sufficient to deposit the densifying species to the first depth below the surface of the article. The species is deposited for a time sufficient to densify the article at the first depth. If the article has porosity over a range of depths, as is often the case, the voltage is first set to densify the article at the greatest depth, and thereafter the voltage is gradually decreased to reduce the depth of densification until the article is densified over the entire range.

20 Claims, 4 Drawing Sheets

DENSIFICATION OF POROUS ARTICLES BY PLASMA ENHANCED CHEMICAL VAPOR INFILTRATION

This invention was made with Government support under contract F04611-93-C-0005 awarded by the Air Force. The Government has certain rights in this invention.

BACKGROUND OF THE INVENTION

This Invention relates to a method of achieving rapid densification of porous articles, and, more particularly, of densifying carbon-carbon composite materials.

Several types of materials are fabricated in a porous initial state and thereafter densified to a fully or nearly fully dense final state. An example of such a material is a carbon-carbon composite material used in aircraft and a spacecraft structures, brakes, and thermal control devices. One such material is composed of carbon fibers woven into a multidimensional array or into planar mats, which are stacked on top of each other in a three-dimensional array termed a preform. This preform containing only fibers is highly porous and has a density of only about 1.1–1.2 grams per cubic centimeter. The preform cannot itself be used in a structural application, because it lacks strength and would disintegrate if too-high a stress were applied.

A composite material having highly desirable properties for use in many elevated temperature applications is formed from this preform by a densification process. Densification is accomplished by introducing a matrix material into the preform, to fill the pores between the fibers.

In current processing technology, carbon is introduced into the preform from an external liquid or gaseous source to make a carbon fiber-carbon matrix composite. A liquid or gaseous source of carbon is contacted to the surface of the preform at an appropriate temperature and pressure. Carbon precursor material is impregnated into the pores from the liquid source or infiltrated into the pores from the gaseous source, or a combination of the two techniques is used. After heating, the carbon deposited between the fibers becomes a carbon matrix that binds the carbon fibers together. The introduction of the carbon gradually increases the density of the material to the range of 1.8–2.2 grams per cubic centimeter, which is suitable for various structural applications. After the carbon is deposited into the pores, the carbon-carbon composite is heated for an extended period of time to graphitize the carbon of the matrix.

The existing impregnation and infiltration techniques are slow, because of surface pore blockage by the carbon deposited from the carbon source. A fraction of the carbon tends to preferentially deposit into the pores near the surface of the preform, reducing the carbon flux into the interior of the preform. Densification tends to occur at the surface first, thereby gradually closing the surface pores and slowing the carbon flux into the interior, so that the interior of the composite material remains porous. It is therefore common practice during densification by these approaches to periodically halt the impregnation or infiltration procedure, machine the densified surface region away, and resume the processing. It has been found that repetition of the carbon deposition and surface machining steps can eventually lead to a dense carbon-carbon composite material. As an example of the time and effort involved, production of a ½ inch thick carbon-carbon composite material by this multi-cycle deposition and machining technique typically requires 400–600 hours of infiltration interrupted by 4–5 surface machining operations.

Carbon-carbon composites and other types of materials that are initially porous but can be densified using less costly methods offer great potential for a variety of applications. However, this potential cannot be readily realized at this time due to the time-consuming, expensive densification processing requiring multiple carbon deposition and machining cycles. There is a need for an improved approach that can achieve the required densification in much less time and at a reduced cost, as compared with the present approach. The present invention fulfills this need, and further provides related advantages.

SUMMARY OF THE INVENTION

The present invention provides a method for controlled densification of a porous article having either open or closed porosity. In this approach, densification is extremely rapid as compared with conventional techniques, and involves only a single processing cycle instead of multiple cycles of carbon deposition and surface machining. The densification time can be reduced to a few percent of that required conventional processing methods. Densification can be made to occur at a selectable depth in the article, and can be accomplished with different agents in a controllable manner.

In accordance with the invention, a method of densifying a porous article comprises the steps of providing a porous article having porosity at a first depth below a surface of the article, creating a plasma adjacent to the surface of the article, introducing a source of a densifying species into the plasma, and electrically biasing the article. The article is biased with respect to the plasma to a polarization opposite in sign to the ionization of the densifying species and to a first voltage sufficient to deposit the densifying species to the first depth below the surface of the article.

In one preferred approach to practicing the invention, a plasma is formed in a react or by high frequency induction. Parallel plate, DC arc, and any other operable technique for forming the plasma can instead be used. The article to be densified is immersed into the plasma, so that the plasma completely surrounds the article. A source of a densifying species is introduced into the plasma. In the case of carbon as the species used to densify the article, a source of carbon that dissociates in the plasma, such as methane, is introduced into the plasma. The source gas dissociates, and the dissociated carbon thereafter ionizes or is activated. When immersed into the plasma, the article immediately assumes a small acquired negative potential relative to the plasma. The negative potential is enhanced by the external application of a further negative bias to the article. The total negative bias causes the activated or ionized densifying species to be accelerated toward the article and deposited into its pores. The magnitude of the total negative bias determines the depth to which carbon is infiltrated below the surface of the article.

Various types of porous articles, such as metals, monolithic ceramics, ceramic matrix composite materials, and polymeric materials may be processed according to the invention. A presently preferred material is carbon-carbon composite material in which a carbon-fiber preform is densified by introducing activated carbon atoms or carbon ions from a precursor material using the plasma enhanced chemical vapor infiltration of the invention.

The approach may be used to densify the article at one or more different depths below the surface by changing the voltage applied in the electrical biasing. To densify an article containing porosity throughout its thickness, the voltage is selected to initially transfer the densifying species to the center of the article with the required applied negative bias voltage. After the center is densified by introduction of the required number of atoms per unit volume, the negative bias voltage can be reduced slightly to densify at a lesser depth. Extending this principle, the applied bias voltage can be gradually reduced to move the zone of densification gradually toward the external surface of the article. In the preferred embodiment, the article to be densified is immersed in the plasma, so that densification can be accomplished from all sides of the article simultaneously. Alternatively, the plasma could be created on only one side of the article, to produce different densities in different regions, gradient densities, or other tailored density properties in the final product.

The problems encountered in conventional infiltration densification are avoided by initiating the densification at the center and working outwardly. A simultaneous sputtering bombardment of the outer surface of the article by the plasma carrier gas (which is typically argon) also aids in preventing the densifying species from closing the surface pores prior to densification of the central portions of the material. However, should there be some closure of the surface pores first, the closure can be reversed by rapidly heating and cooling the article in the plasma to form surface thermal cracks in the densified matrix region. The plasma-assisted process can then resume, with deposition occurring through the system of surface cracks.

Because the present approach is based upon deposition of the densifying species at a controlled depth, it can be used to perform densification at various depths in a selectable manner. For example, layers of various types could be deposited at controlled depths. Thus, most of the densifying matrix material could be a material with no or little electrical conductivity, except that a conductive layer of another material could be deposited at a selected depth. There is therefore great flexibility in selecting the precise nature and structure of the densification of the porous article.

The present invention thus provides a rapid approach for densifying porous structures in a highly controlled manner. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
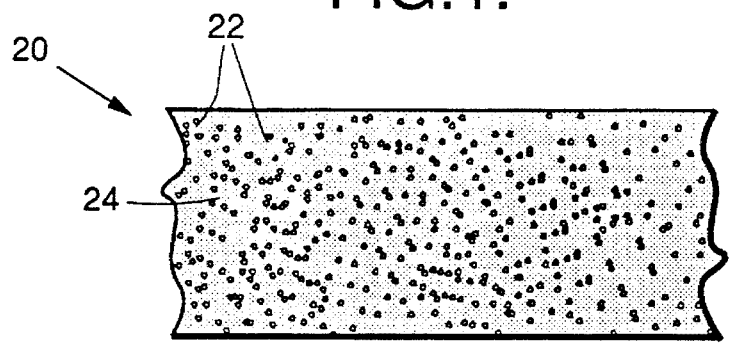
FIG. 1 is a schematic sectional view of a porous article.
Figure 2:
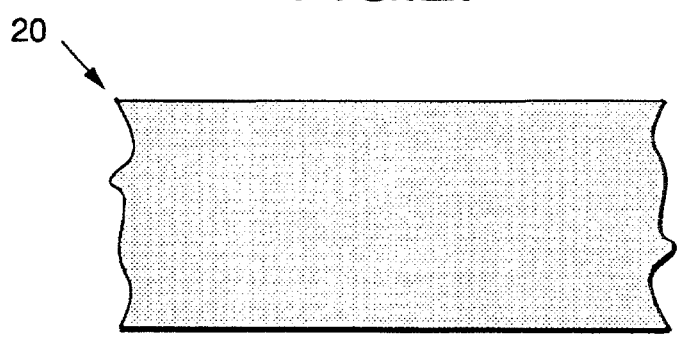
FIG. 2 is a schematic representation of the article of FIG. 1.

FIG. 1 depicts a porous article 20. The article can be prepared in many ways, but a preferred article 20 is formed as a stack of woven or pressed mats of carbon fibers 22. The stack can be pressed to achieve a partial compaction, but there remains a significant concentration of pores 24 between the carbon fibers in such an article in its as-prepared state. FIG. 2 is a schematic representation of the article 20, omitting the details of the carbon fibers 22 and the pores 24. This depiction serves as a basis for illustrating the modifications in structure resulting from densification.

Figure 3:
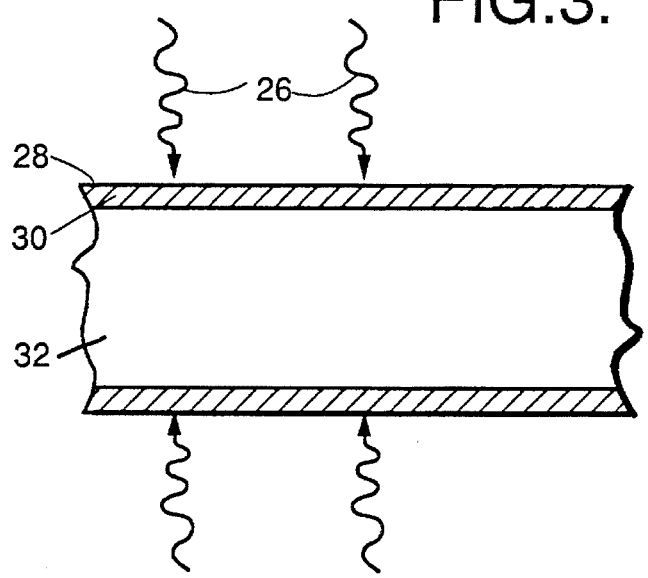
FIG. 3 is a schematic sectional view of the article of FIG. 2, during conventional infiltration densification.

FIG. 3 depicts such an article 20 which is undergoing densification by conventional impregnation or infiltration processing. In this approach, a liquid or gas that decomposes to produce a deposited species, indicated schematically as arrows 26, is contacted to a surface 28 of the article 20, which is normally heated in a furnace to enable the infiltration and decomposition. The decomposable gas or liquid diffuses into the article 20 from its surface 28. In contact with the fibers that create the pores, the gas or liquid decomposes to produce the deposited species. In the preferred case, the species 26 could be, for example, methane gas that decomposes in contact with the carbon fibers to produce deposited carbon. The object of the processing is to fill the pores with deposited carbon, thereby densifying the article.

At first, the flow rate of the species 26 into the article 20 is relatively high. But a portion of the species 26 decomposes when it first enters the surface 28. Surface layers 30 of deposited carbon build up at and adjacent to the surface 28. An ever-decreasing flux of the species 26 does, however, continue to pass through the surface layers 30 to reach the interior 32 and decompose there, depositing carbon in the pores. These densifying surface layers 30 inhibit the further diffusion of the species 26 into the interior 32, slowing the densification of the interior to an unacceptably low value. It has been the practice to halt the infiltration processing at intervals, machine away the surface layers 30 to expose new surface whose pores have not been closed, and resume impregnation or infiltration. Removing the surface layers 30 permits a temporarily increased rate of flow of the species 26, but in time the same surface layers 30 again develop and the machining must be repeated. In such conventional multi-cycle processing, about 400–600 hours of infiltration, with 4–6 interspersed surface machining operations, is required to densify a ½ inch thick porous carbon fiber article 20 from an initial density of about 1.1–1.2 grams per cubic centimeter to a final density of about 1.8–1.9 grams per cubic centimeter.

Figure 4:
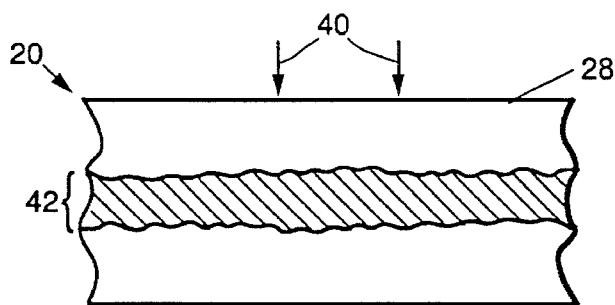
FIG. 4 is a schematic sectional view of the article of FIG. 2, in the initial stages of densification according to the invention.
Figure 5:
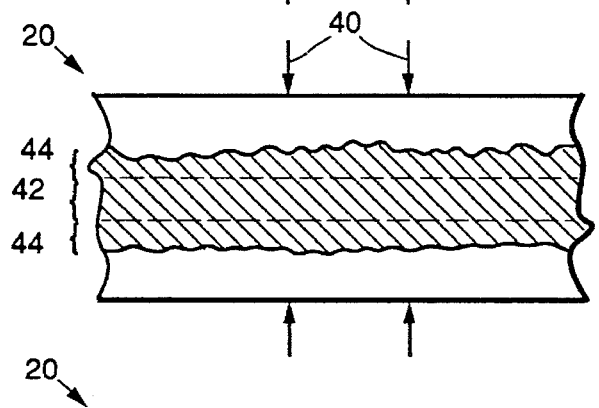
FIG. 5 is a schematic sectional view of the article of FIG. 4, at a later stage of the densification.
Figure 6:
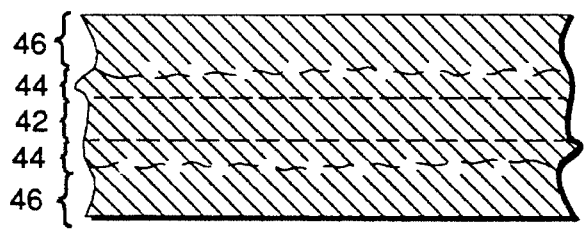
FIG. 6 is a schematic sectional view of the article of FIG. 5, at the completion of densification.

FIGS. 4–6 illustrate the sequence of deposition of a species 40 into the pores of the article 20 according to the present invention. As shown in FIG. 4, the species 40 is initially introduced into the article 20 at a first depth 42 below the surface 28, with little or none of the species 40 depositing into regions adjacent to the surface 28. When the desired degree of deposition and densification is achieved at the first depth 42, the deposition parameters are adjusted to deposit the species 40 at a second, lesser depth 44, FIG. 5.

The adjustment is continued to deposit the species 40 in a surface layer 46 to complete the densification through the entire thickness of the article, FIG. 6. The blockage of flow inherent in the conventional infiltration process discussed in relation to FIG. 3 is avoided by initially depositing the species at the greatest depths and then decreasing the deposition depth over time to complete the densification.

Figure 9:
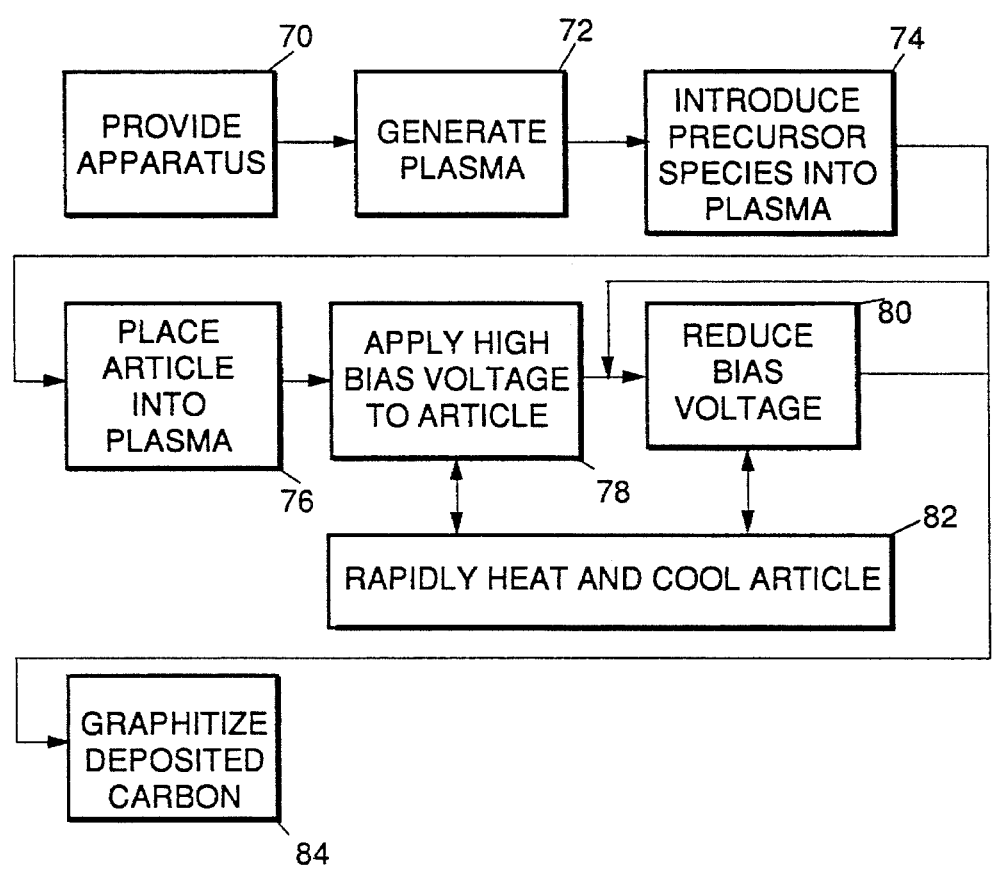
FIG. 9 is a block flow diagram for the process of the invention.
Figure 10:
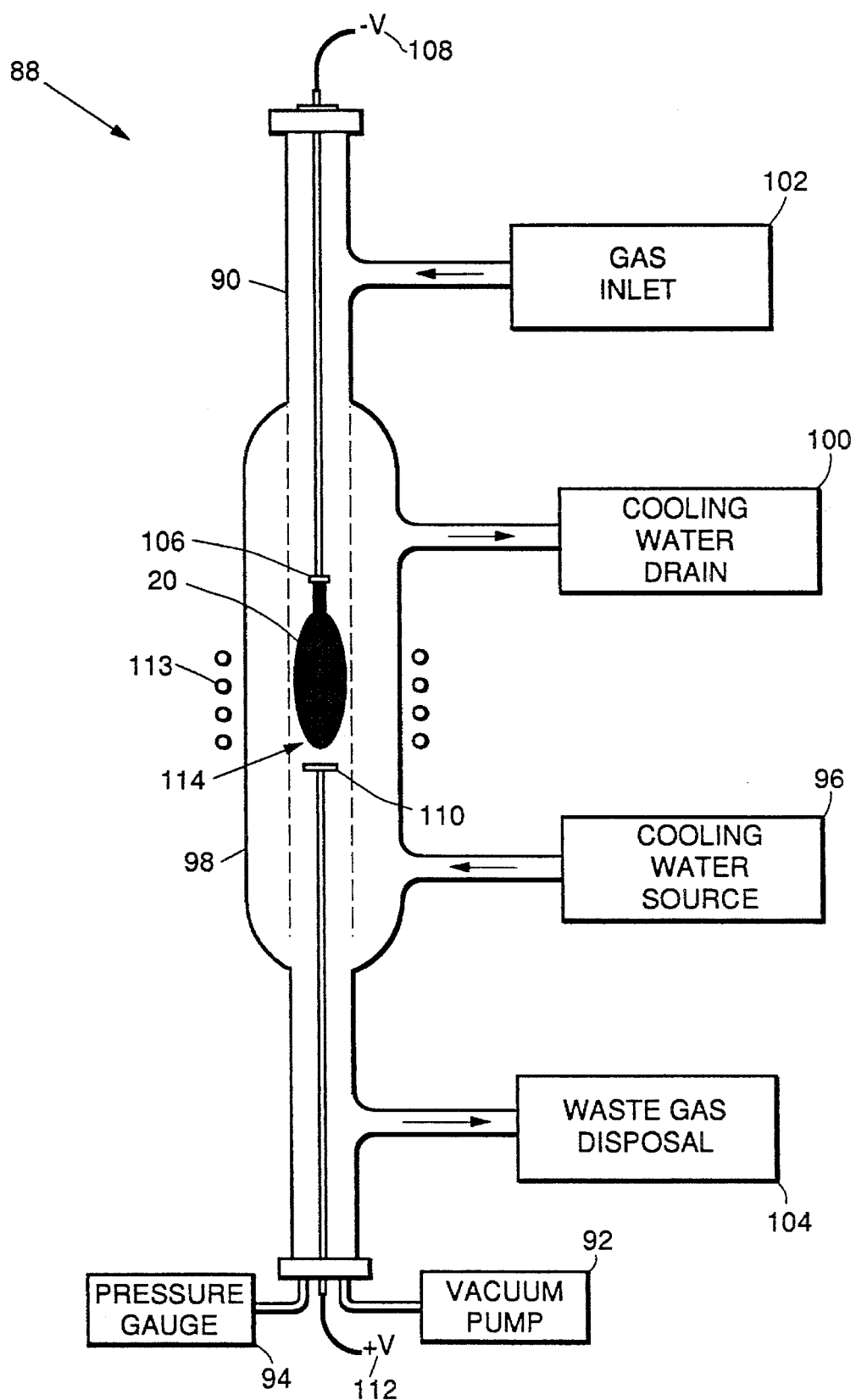
FIG. 10 is a schematic view of an apparatus for practicing the invention.

FIG. 9 illustrates a method for densifying a porous article, and FIG. 10 depicts an apparatus that can be used for this purpose. An apparatus 88 is provided, numeral 70. In a preferred approach, a reaction chamber 90 of the apparatus 88 is made of an electrically nonconducting material such as a ceramic or glass to permit external induction heating of the gas in the interior. A vacuum pump 92 evacuates the reaction chamber 90, and a pressure/vacuum gauge 94 measures the pressure in the reaction chamber 90. The reaction chamber 90 can be externally cooled by water flowing from a cooling water source 96, through an overlying cooling Jacket 98, and to a drain 100. A controlled gaseous environment is created in the reaction chamber 90 by flowing gas from a gas source 102, through the reaction chamber 90, and to a waste gas disposal apparatus 104.

Within the reaction chamber 90, the article 20 to be densified is supported on a specimen holder 106, which also acts an electrical contact to a first terminal 108 of a voltage source. The specimen holder and thence the article 20 can be translated axially along the length of the reaction chamber 90 while being rotated, so that the article 20 can be inserted into the plasma region or removed from the plasma region, as desired. An electrode 110 is positioned adjacent to the article 20 and connected to a second terminal 112 of the voltage source to complete the circuit of the voltage source. An induction coil 113 is wound around the cooling Jacket 98 to generate the plasma in the gas within the reaction chamber 90.

In operation, the reaction chamber 90 is evacuated and then backfilled with an inert gas such as argon. The induction coil 113 is energized at a frequency of from about 1 to about 13.6 megahertz, most preferably about 5 megahertz, producing a plasma in the argon gas within the reaction chamber 90, numeral 72 of FIG. 9. A flow of a gaseous precursor source of a densifying species that decomposes in the plasma is introduced from the gas source 102, numeral 74. The gaseous source can be any reactant that decomposes to produce the densifying species. In the preferred approach, a partial pressure of about 0.1–100 Torr of methane ($CH_4$) is flowed through the reaction chamber 90. The methane decomposes in the plasma to produce activated carbon atoms and positively charged carbon ions ($C^+$), both of which can be infiltrated into the article 20.

The article 20 is introduced into the plasma, numeral 76, by translating the specimen holder 106 to the proper location. In this apparatus, the article 20 is fully immersed into the plasma, so that the plasma surrounds the article on all sides. Upon entering the plasma, the article 20 acquires a negative voltage, but this acquired voltage is typically too small to be effective in accomplishing infiltration of the carbon ions and/or activated atoms into the article 20. A further negative bias is applied to the article 20 from the first voltage source 108, numeral 78. The total negative bias on the article is on the order of from about 100 to about 3000 volts. (If infiltration of other species were to be performed, the bias voltage could be varied to be opposite to that of the ionic species in the plasma.)

The negative bias voltage accelerates the carbon ions and activated carbon into the workpiece. The carbon penetrates into the workpiece to a penetration depth range which is accurately controllable by the magnitude of the bias voltage. When the ions and activated carbon species reach their maximum penetration depth, they deposit onto the nearest available surfaces. (Penetration and deposition occur over a small range of depths rather than a single depth value due to variations in structure and charge.) As the ions deposit, they decrease the porosity and increase the local density of the material. For example, carbon ions are accelerated to the center of a ½ inch thick piece of carbon fiber precursor material by a negative voltage of about 100–3000 volts.

The deposition of ions at the first voltage is continued for a time sufficient to densify to a desired degree the porous material at the penetration depth range corresponding to the applied voltage. The (absolute value of the) bias voltage of the first voltage source 108 is then decreased slightly and gradually, reducing the penetration depth range of the ions, numeral 80. Densification at this second depth range is continued until the required degree of local densification is reached. The reduction of the bias voltage is gradually continued, moving the current region of densification from the greatest depth toward the least depth that is to be densified.

Figure 7:
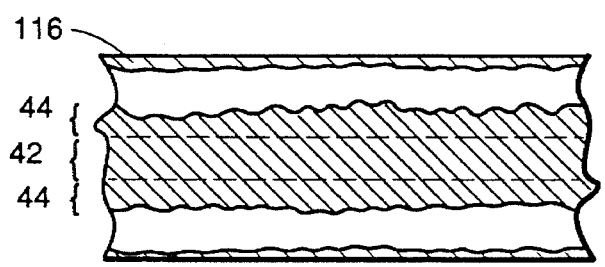
FIG. 7 is a schematic sectional view of the article of FIG. 5, during removal of surface pore blockage.

During the processes 78 and 80, there can be a minor degree of deposit ion of some of the accelerated ions in the near surface regions, as seen in FIG. 7. These deposited ions can slow the rate of densification at the greater depths. Near-surface deposition of the densifying species tends to be minimal, due to the center-to-surface densification approach discussed above and also due to a simultaneous sputtering ion bombardment of the surface of the article by the plasma supporting gas, which is typically argon. The sputtering ion bombardment occurs simultaneously with the deposition of the densifying species because of the presence of the plasma supporting gas.

In the event that some near-surface deposition of the densifying species does occur, the pore structure near the surface can be opened by intensely heating the surface of the article with the induction coil 118 or other heat source, and then rapidly cooling the article, numeral 82. Thus, the article 20 can be heated from a deposition temperature of about 850° C. to about 3000° C. in 1–2 seconds and then rapidly cooled from that temperature. The rapid heating and cooling thermally stresses the article 20, creating thermal surface cracks through the deposited material that permits continued deposit at the selected depth range. The article is not removed from the reaction chamber during this heating, and no separate machining operation is required.

The infiltrated carbon is deposited in the amorphous form of carbon, and it is often desirable to convert the carbon to the graphitic form. To accomplish graphitization of the deposited carbon, the article is heated to a temperature of more than about 2200° C., and preferably to a temperature of about 3000° C., within the reaction chamber 90, numeral 84. Heating is accomplished by increasing the chamber pressure to near 1 atmosphere pressure and substantially increasing the power level, to form a thermal plasma around the article. In this case, the electron and ion temperature s are nearly the same and in a state of thermodynamic equilibrium. Heating to the graphitization temperature is accomplished in about 12 hours, and the article is held at the graphitization temperature for a period of at least about 1 hour. (Alternatively, the article can be removed to another system and heated to elevated temperature by using either resistance or induction heating.)

This preferred approach to graphitization is contrasted with the conventional approach. In the conventional approach, after 4–6 cycles of infiltration and machining, the article is placed into a furnace and heated to the graphitization temperature over a period of about 1 week. The slow heating is required to permit volatile substances deposited into the porous structure along with the carbon to slowly diffuse out of the structure. Too rapid a heating would cause bubble formation and blistering or cracking of the article. The article is thereafter held at the graphitization temperature for at least about 1 hour. The entire process of densifying and graphitizing a carbon preform typically requires about 6 months to complete by the prior approach, as compared with the present process which requires about 3–4 days.

Figure 8:
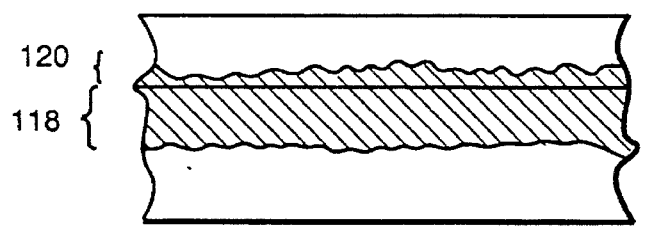
FIG. 8 is a schematic sectional view of the article of FIG. 2, during densification according to the present invention in which a layered densification structure is formed.

The approach of the invention is based upon the precise deposition of the densifying species at a controlled depth. This feature can be utilized to produce other structures as well. For example, as shown in FIG. 8, a central layer 118 can be formed using one densifying species as previously described. A second densifying species can thereafter be used to create a second layer 120 of a different composition and density at a lesser depth. The layer 120 could be formed on both sides of the central layer 118, or, by varying the plasma or masking the opposite side, on only one side of the central layer. These principles can be used to deposit a wide variety of layers with controllable compositions and densities at controllable depths.

The present invention has been reduced to practice using the above-described approach and apparatus. Rectangular pieces of ½ inch thick carbon-fiber preform, six inches on a side, were densified. The gas flow was 100–1000 cubic centimeters per minute of argon, 50–500 cubic centimeters per minute of hydrogen, and 20–200 cubic centimeters per minute of methane. The applied bias voltage was from about −100 to about −3000 volts for densification of the center of the pieces, and the bias voltage was gradually decreased to about −10 to about −200 volts for the final surface densification. The density of the articles was increased from about 1.12 to about 1.8 grams per cubic centimeter, in about 4 hours. Only a single cycle of infiltration is required. The article is not removed from the apparatus 88 for machining or other treatment during this process.

For comparison, a comparable densification of the same material by conventional gas infiltration and 4–6 machining cycles requires about 500–600 hours.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of densifying a porous article, comprising the steps of:

providing a porous article having porosity at a first depth below a surface of the article;

creating a plasma adjacent to the surface of the article;

introducing a gaseous source of a densifying species into the plasma; and electrically biasing the article with respect to the plasma to a polarization opposite in sign to an ionization state of the densifying species and to a first voltage sufficient to deposit the densifying species to the first depth below the surface of the article.

2. The method of claim 1, wherein the step of providing a porous article includes the step of providing an array of carbon fibers.

3. The method of claim 1, wherein the step of providing a porous article includes the step of providing a material selected from the group consisting of a metal, a monolithic ceramic, a ceramic matrix composite material, and a polymeric material.

4. The method of claim 1, wherein the step of creating a plasma includes the steps of providing a gaseous species adjacent to the surface of the article, and applying an electric field adjacent to the surface of the article.

5. The method of claim 1, wherein the step of introducing a gaseous source includes the step of introducing a gaseous decomposable chemical precursor compound source of the densifying species into the plasma.

6. The method of claim 1, wherein the step of introducing a gaseous source includes the step of introducing a gaseous source of carbon into the plasma.

7. The method of claim 1, wherein the step of introducing a gaseous source includes the step of introducing a gaseous carbon-containing compound into the plasma.

8. The method of claim 1, wherein the step of electrically biasing includes the step of applying a negative voltage to the article.

9. The method of claim 1, the porous article includes the step of providing a porous article further having porosity at a second depth below a surface of the article, including an additional step, after the step of electrically biasing the article with respect to the plasma opposite to the ionization state of the densifying species to a first voltage, of electrically biasing the article with respect to the plasma to a polarization opposite in sign to the ionization of the densifying species and to a second voltage sufficient to deposit the densifying species to the second depth below the surface of the article, the second voltage being less than the first voltage.

10. The method of claim 1, including an additional step, conducted intermittently with the step of electrically biasing, of rapidly heating and thereafter cooling the surface of the article to create surface cracks in the article.

11. The method of claim 1, including an additional step, after the step of electrically biasing, of heating the article to a graphitization temperature.

12. A method of densifying a porous article, comprising the steps of:

providing a porous article having porosity at depths below a surface of the article ranging from a greatest depth to a least depth;

creating a plasma adjacent to the surface of the article;

introducing a gaseous source of a densifying species into the plasma; and electrically biasing the article with respect to the plasma to a polarization opposite in sign to an ionization state of the densifying species and to a first voltage sufficient to deposit the densifying species to the greatest depth below the surface of the article, and gradually decreasing the voltage to a second voltage sufficient to deposit the densifying species to the least depth below the surface of the article.

13. The method of claim 12, wherein the step of providing a porous article includes the step of providing an array of carbon fibers, wherein the step of introducing a gaseous source includes the step of introducing a gaseous carbon-containing compound into the plasma, and wherein the step of electrically biasing includes the step of applying a negative voltage to the article.

14. The method of claim 12, including an additional step, conducted intermittently with the step of electrically biasing, of rapidly heating and thereafter cooling the surface of the article to create surface cracks in the article.

15. The method of claim 12, including an additional step, after the step of electrically biasing, of heating the article to a graphitization temperature.

16. A method of densifying a porous article, comprising the steps of:

providing a porous carbon preform having porosity at depths below a surface of the preform ranging from a greatest depth to a least depth;

creating a plasma adjacent to the surface of the article;

introducing a gaseous source of a carbon into the plasma; and electrically biasing the article with respect to the plasma negatively to a first voltage sufficient to deposit the densifying species to the greatest depth below the surface of the article, and gradually decreasing the voltage to a second voltage sufficient to deposit the densifying species to the least depth below the surface of the article.

17. The method of claim 16, including an additional step, conducted intermittently with the step of electrically biasing, of rapidly heating and thereafter cooling the surface of the article to create surface cracks in the article.

18. The method of claim 16, including an additional step, after the step of electrically biasing, of heating the article to a graphitization temperature.

19. The method of claim 16, wherein the step of introducing a gaseous source includes the step of introducing gaseous methane into the plasma.

20. A method of densifying a porous article, comprising the steps of:

providing a gaseous porous article having porosity at depths below a surface of the article ranging from a greatest depth to a least depth;

providing a source of a species used to fill the porosity;

energizing the species; and depositing the species into the porosity of the article at the greatest depth initially and thereafter controllably decreasing the deposition depth until the species is deposited at the least depth.

* * * * *